United States Patent [19]

Debus, Jr.

[11] Patent Number: 4,773,034
[45] Date of Patent: Sep. 20, 1988

[54] ADAPTIVE EQUALIZER UTILIZING A PLURALITY OF MULTIPLIER-ACCUMULATOR DEVICES

[75] Inventor: Walter Debus, Jr., Nottingham, N.H.

[73] Assignees: American Telephone and Telegraph Company, New York, N.Y.; Bell Telephone Laboratories, Incorporated, Murray Hill, N.J.

[21] Appl. No.: 732,403

[22] Filed: May 9, 1985

[51] Int. Cl.⁴ .............................................. G06F 7/38
[52] U.S. Cl. ................................................ 364/724.2
[58] Field of Search ...................... 364/724; 375/12–14

[56] References Cited

U.S. PATENT DOCUMENTS

| | | | |
|---|---|---|---|
| 3,633,014 | 1/1972 | Lemp et al. | 364/724 |
| 3,633,105 | 4/1972 | Lender et al. | 364/724 |
| 3,651,316 | 3/1972 | Gibson | 364/724 |
| 3,699,321 | 10/1972 | Gibson | 364/724 |
| 3,723,911 | 3/1973 | Forney, Jr. | 375/13 |
| 3,732,410 | 5/1973 | Mackechnie | 364/724 |
| 3,965,338 | 6/1976 | van Gerwen et al. | 364/724 |
| 3,971,922 | 7/1976 | Bellanger et al. | 364/724 |
| 3,978,323 | 8/1976 | Mecklenbrauker et al. | 364/724 |
| 4,027,258 | 5/1977 | Perreault | 375/12 |
| 4,184,129 | 1/1980 | Macchi nee Danyon | 364/724 |
| 4,237,554 | 12/1980 | Gitlin et al. | 364/724 |
| 4,422,175 | 12/1983 | Binham et al. | 375/14 |
| 4,491,701 | 1/1985 | Duttweiler et al. | 364/724 |
| 4,575,857 | 3/1986 | Murakami | 375/14 |
| 4,615,038 | 9/1986 | Lim et al. | 364/724 |
| 4,649,505 | 3/1987 | Zinser, Jr. et al. | 375/14 |

OTHER PUBLICATIONS

L. Schirm IV, "Multiplier-Accumulator Application Notes", Jan. 1980, pp. 1–9.

Primary Examiner—Gary V. Harkcom
Assistant Examiner—Dale M. Shaw
Attorney, Agent, or Firm—David R. Padnes

[57] ABSTRACT

Each multiply-accumulate device, in an adaptive equalizer, multiplies each input signal sample by an associated coefficient in an ensemble, stores the result and periodically outputs the accumulated results as the equalized input signal. A rotating coefficient register in the adaptive equalizer successively associates each coefficient in the ensemble with a different multiply-accumulate device. Coefficient update circuitry is also provided which periodically updates the coefficients in the ensemble so as to optimize equalizer performance.

12 Claims, 7 Drawing Sheets

FAST CONVERGENCE

LOW NOISE

FAST CONVERGENCE LOW NOISE

HYSTERESIS

FIG. 8

| CORRELATE FOR $C_0$ | | | | CORRELATE FOR $C_{-1}$ | | | | CORRELATE FOR $C_{+1}$ | | | |
|---|---|---|---|---|---|---|---|---|---|---|---|
| RAM 309 | | RAM 310 | | RAM 309 | | RAM 310 | | RAM 309 | | RAM 310 | |
| MEM ADDR | TERM | TERM | MEM ADDR | MEM ADDR | TERM | TERM | MEM ADDR | MEM ADDR | TERM | TERM | MEM ADDR |
| 1 | $e'_1$ | $w'_1$ | 1 | 1 | $e'_1$ | $w'_1$ | 1 | 1 | $e'_1$ | $w'_1$ | 1 |
| 2 | $e'_2$ | $w'_2$ | 2 | 2 | $e'_2$ | $w'_2$ | 2 | 2 | $e'_2$ | $w'_2$ | 2 |
| 3 | $e'_3$ | $w'_3$ | 3 | 3 | $e'_3$ | $w'_3$ | 3 | 3 | $e'_3$ | $w'_3$ | 3 |
| 4 | $e'_4$ | $w'_4$ | 4 | 4 | $e'_4$ | $w'_4$ | 4 | 4 | $e'_4$ | $w'_4$ | 4 |
| 5 | $e'_5$ | $w'_5$ | 5 | 5 | $e'_5$ | $w'_5$ | 5 | 5 | $e'_5$ | $w'_5$ | 5 |
| 6 | $e'_6$ | $w'_6$ | 6 | 6 | $e'_6$ | $w'_6$ | 6 | 6 | $e'_6$ | $w'_6$ | 6 |
| ... | ... | ... | ... | ... | ... | ... | ... | ... | ... | ... | ... |
| M-1 | $e'_{M-1}$ | $w'_{M-1}$ | M-1 | M-1 | $e'_{M-1}$ | $w'_{M-1}$ | M-1 | M-1 | $e'_{M-1}$ | $w'_{M-1}$ | M-1 |
| M | $e'_M$ | $w'_M$ | M | M | $e'_M$ | $w'_M$ | M | M | $e'_M$ | $w'_M$ | M |

ADAPTIVE EQUALIZER UTILIZING A PLURALITY OF MULTIPLIER-ACCUMULATOR DEVICES

TECHNICAL FIELD

The present invention relates to digital communications and, more particularly, to a digitallyimplemented adaptive equalizer for high-speed applications.

BACKGROUND OF THE INVENTION

Adaptive equalizers are used to compensate for the effects of distortion in the transmission channel of a communications system. The typical equalizer structure is a time-domain network having a tapped delay line in the input signal path, a multiplier connected to each delay line tap for multiplying each tap signal by a tap-weight coefficient, and a summing circuit for combining the products formed by each multiplier into the equalizer output signal. In general, for this structure, the greater the number of taps and multipliers, the more precise the distortion compensation. In addition, since the distortion in the transmission channel is time-varying, the tap-weight coefficients must be adjusted so that the compensation provided tracks the distortion. A number of schemes having varying degrees of accuracy, such as zero forcing and least mean square, are utilized to provide the tap-weight coefficient adjustment.

A number of problems have persisted with the use of adaptive equalizers. First, the number of devices required in the summing network grows exponentially with each additional tap. Second, the cost of the hardware reqired to implement the more accurate tap-weight coefficient adjustment algorithms is prohibitive in certain system applications.

SUMMARY OF THE INVENTION

The present invention overcomes the limitations of prior art adaptive equalizers through the use of a plurality of multiply-accumluate devices and a rotating coefficient register. Each multiply-accumulate device multiplies each input signal sample by an associated coefficient in an ensemble, stores the result and periodically outputs the accumulated results as the equalized input signal. The rotating coefficient register successively associates each coefficient in the ensemble with a different multiply-accumulate device. To track changes in the transmission channel distortion, coefficient update circuitry revises the coefficients in the ensemble in accordance with a selected algorithm.

A feature of the present invention is its suitability for high-speed application. A further feature of the present invention is that it can be readily adapted to incorporate different coefficient revision algorithms.

BRIEF DESCRIPTION OF THE DRAWING

FIG. 8 illustrates the RAM address manipulation provided for coefficient correlation;

DETAILED DESCRIPTION

Figure 1:
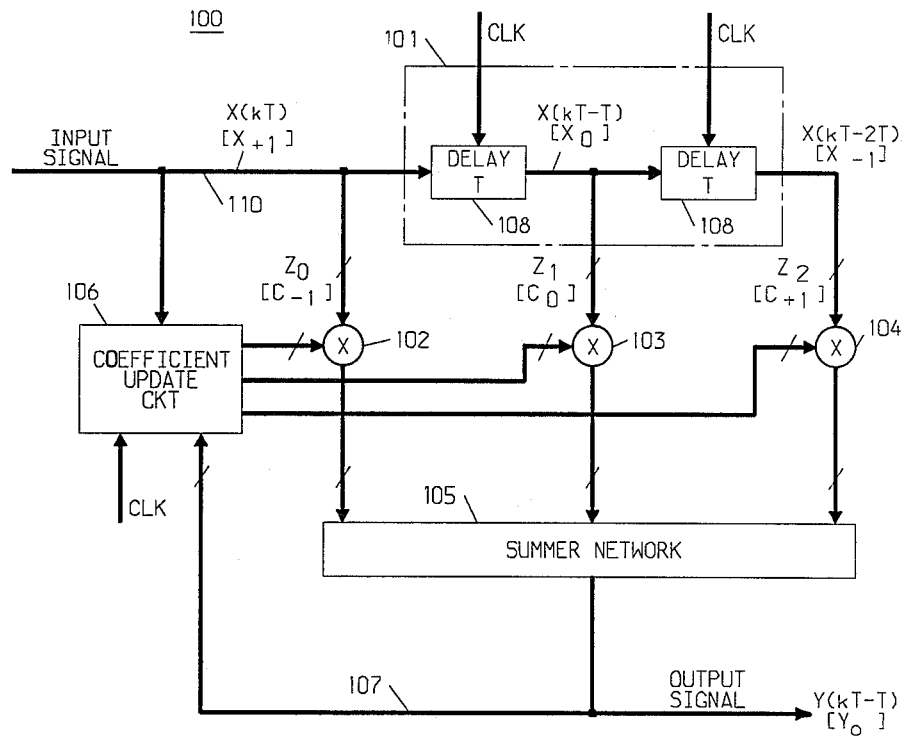
FIG. 1 is a schematic diagram of a prior art adaptive equalizer.

A prior art 3-tap adaptive equalizer 100 is shown in FIG. 1. Equalizer 100 includes a tapped delay line 101, multipliers 102, 103 and 104, summing network 105 and coefficient update circuit 106. Each of the multipliers forms the product of the supplied input signal samples and a tap-weight coefficient $Z_i$. The output signal on bus 107 is then generated by adding the products formed by each of the multipliers via summing network 105. The appropriate tap-weight coefficient values are supplied and adjusted by coefficient update circuit 106. For synchronous operation, each of the serially connected delay elements 108 which form tapped delay line 101 and coefficient update circuit 106 is strobed by a clock signal, CLK, at the baud rate of the input signal. While circuit 106 can utilize any one of a number of coefficient updating algorithms, for the interconnections shown in FIG. 1, circuit 106 forms the appropriate tap-weight coefficients in response to the input and output signals using the well-known least mean square algorithm.

The response of the adaptive equalizer is controlled by the tap-weight coefficients and can be expressed as $$Y(KT) = \sum_{i=0}^{N} Z_i X(KT - iT); \quad (1)$$

where X(KT) and Y(KT) are the input and output pulse samples at time KT, respectively, and $Z_i$ is the tap-weight coefficient for the $i^{th}$ tap. For synchronous equalizers, the tap delay T provided by delay elements 108 is equal to the symbol duration of the transmitted signal. For notation simplicity, the sampled values and the tap-weight coefficients are normalized to the center tap, i.e., $X(KT-T)=X_0$, $Y(KT-T)=Y_0$ and $Z_1=C_0$. Using this abridged notation and redefining the tap-weight coefficients as coefficients $C_i$, the first three terms of the sampled output signal sequence are:

$$Y_0 = C_{-1}X_1 + C_0X_0 + C_1X_{-1} \quad (2)$$

$$Y_1 = C_{-1}X_2 + C_0X_1 + C_1X_0 \quad (3)$$

and $$Y_2 = C_{-1}X_3 + C_0X_2 + C_1X_1. \quad (4)$$

Figure 2:
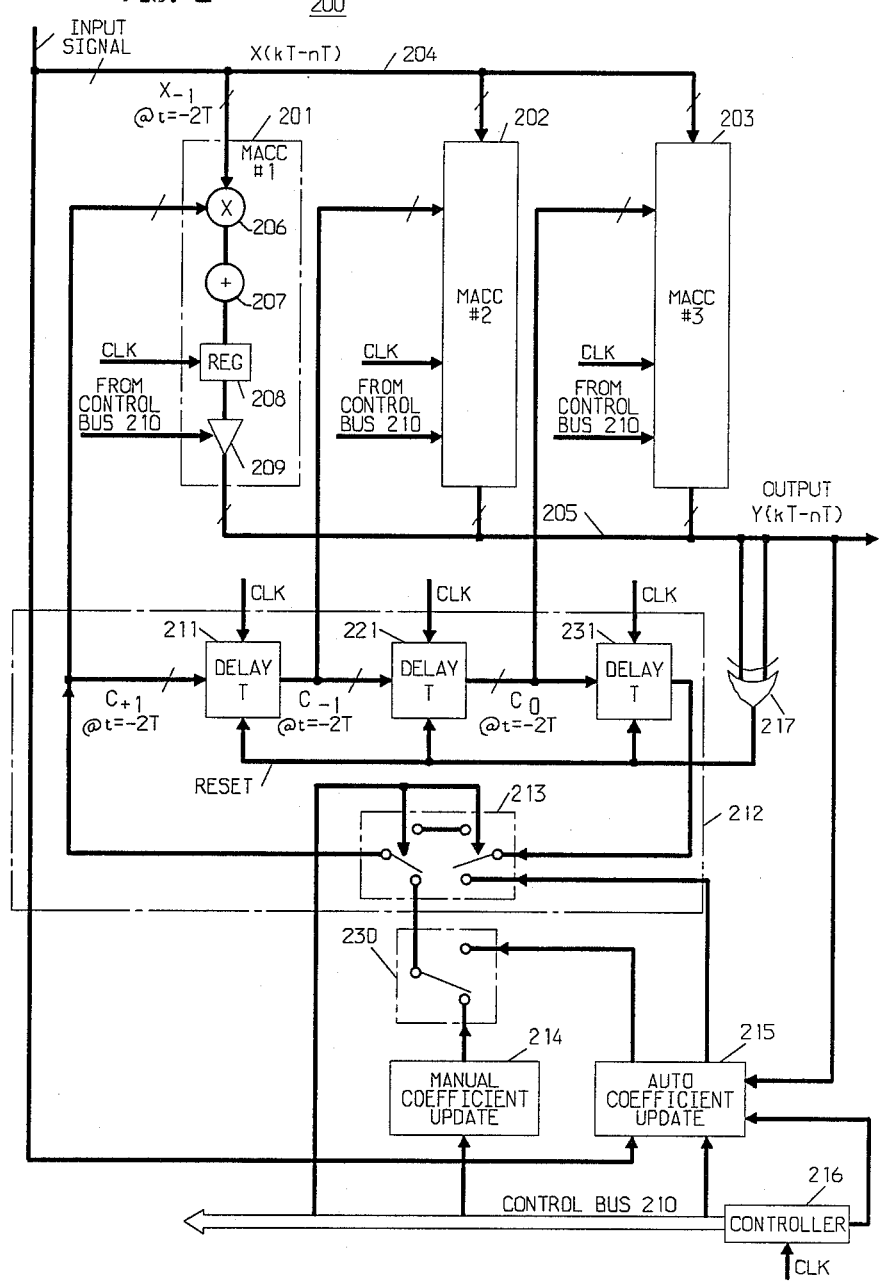
FIG. 2 is a schematic diagram of an adaptive equalizer in accordance with the present invention.

A 3-tap adaptive equalizer 200, in accordance with the present invention, is shown in FIG. 2. Equalizer 200 includes three identical multiply-accumulate devices 201, 202, and 203 which are disposed in parallel between input bus 204 and output bus 205. It will, of course, be understood that the use of three multiply-accumulate devices is merely illustrative and that any plurality of devices can be used. Each multiply-accumulate device multiplies input signal samples on bus 204 by an associated coefficient in an ensemble, stores the result and periodically outputs the accumulated results as the equalized input signals on output bus 205. These functions are provided by an internal multiplier 206, an accumulator, comprising a summer 207 and a storage register 208 strobed by the baud rate clock CLK, and a tristate gate 209. Gate 209 outputs the contents of register 208 onto bus 205 in response to a control signal on control bus 210. At other times, gate 209 provides a high impedance output which effectively isolates each multiply-accumulate device from bus 205. Devices 201 through 203 are commercially available from a variety of manufacturers. One such device is the model TDC1008, manufactured by TRW.

Delay elements 211, 221 and 231 each provide a delay of T and, when serially interconnected in a continuous loop, form rotating coefficient register 212. Register 212 successively associates each coefficient in the ensemble with a different multiply-accumulate device. At selected times, switch 213 is toggled via a switch control signal on control bus 210 to receive the current coefficients from delay element 231 and to inject new coefficients into delay element 211. These new coefficients are supplied from either manual coefficient update circuit 214 or automatic coefficient update circuit 215. The selection of the source of the new coefficients is determined by manually toggling switch 230.

Circuit 214 advantageously provides for the insertion of specific coefficient value for testing and system analysis while circuit 215 automatically adjusts the coefficients to their optimal values with changes in the transmission channel distortion. This adjustment can be in accordance with any of the adjustment algorithms used in the equalizer of FIG. 1. Controller 216 provides the necessary control signals on bus 210 in response to the baud rate clock CLK. Exclusive-OR gate 217, connected to particular leads of output bus 205, generates a reset signal which is applied to delay elements 211, 221 and 231 to preclude improper coefficient convergence. Such improper convergence can, at times, arise with the use of certain tap-weight adjustment algorithms.

The operation of equalizer 200 can be further understood by following the input signal and coefficient notations shown in FIG. 2. At time $t=-2T$, coefficient $C_{+1}$ and $X_{-1}$ are multiplied and stored by multiply-accumulate device 201. At time $t=-T$, due to the rotation of the coefficients, $C_o$ and $X_o$ are multiplied and added to the $C_{-1}X_{-1}$ product by device 201. At time $t=0$, $C_{+1}$ and $X_{+1}$ are multiplied and added to the previous product-sum term, after which the total sum is placed onto bus 205 and register 208 is cleared. Thus, at time $t=0$, the output, $Y_o$, of equalizer 200 is equal to the $Y_o$ output of the adaptive equalizer of FIG. 1 and is expressed by equation (2). At time $t=T$, multiply-accumulate device 202 has had time to accumulate a 3-term summation, $Y_1$, and gate it onto bus 205. Here again, $Y_1$ of equalizer 200 is equivalent to the $Y_1$ term in equation (3). At time $t=2T$, multiply-accumulate device 203 outputs a 3-term summation, $Y_2$, equivalent to that of equation (4). This process is repeated again and again so that for each clock period a new output appears on bus 205 and its value is equal to a 3-term summation. Therefore, while the structure of FIG. 2 differs markedly from that of FIG. 1, the outputs of the two structures are the same for a given input signal and coefficient set.

The advantage of the present invention structure over the prior art structure is hardware simplicity. Internal to each multiply-accumulate device is the network for doing double-precision multiplication and addition. This eliminates the need for a large discrete adder tree network. In addition, internal to each multiply-accumulate device is a 3-bit register to account for overflow. To incorporate an overflow feature into the prior art structure would require an even larger adder tree network. The prior art structure also has the disadvantage of a nonlinear chip count growth in the adder tree for each additional tap that is included in the equalizer. Contrary to this nonlinear chip count growth, for each additional tap in the present invention, only one additional multiply-accumulate device and one additional shift register in the rotating coefficient register is required.

Figure 3:
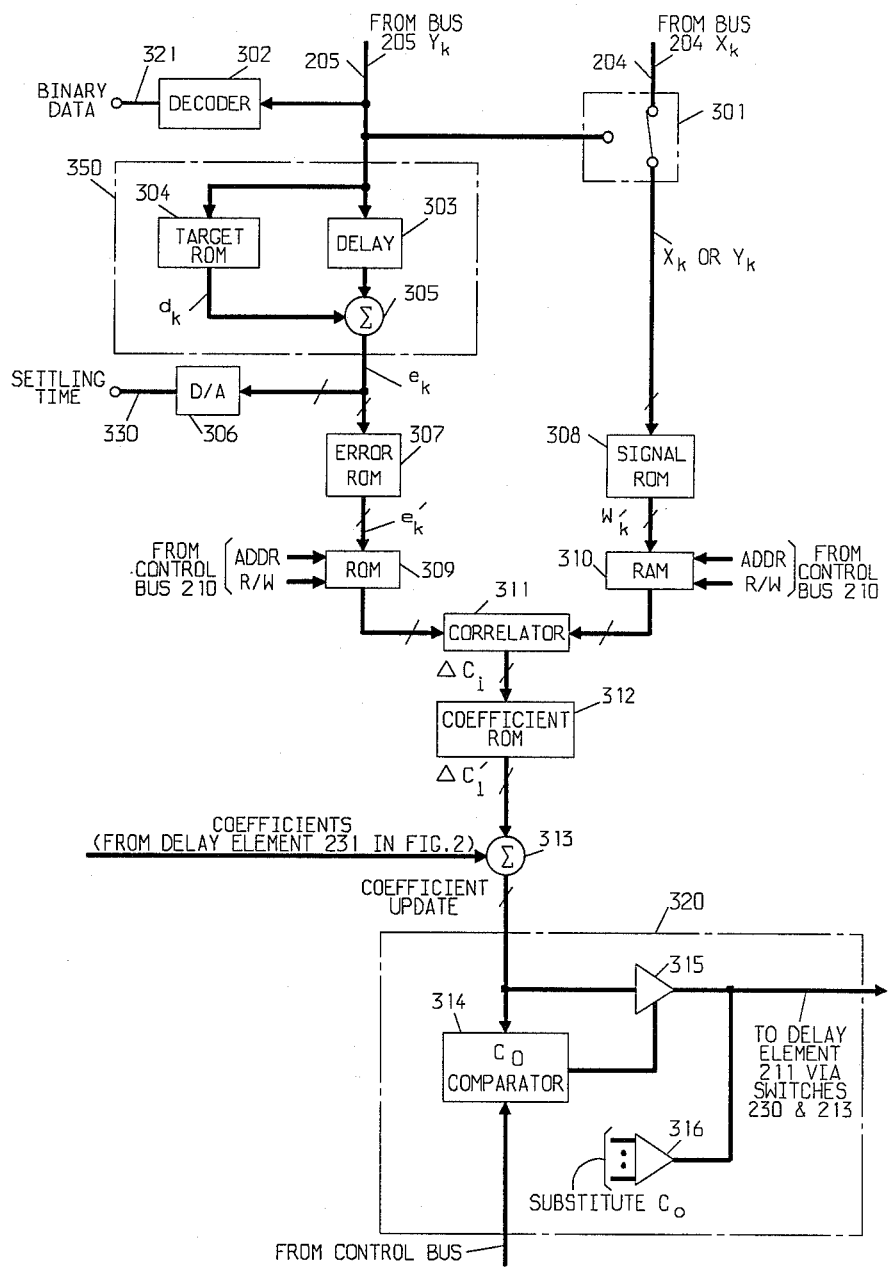
FIG. 3 is a schematic diagram of the automatic coefficient update circuit in FIG. 2.

Refer now to FIG. 3 which shows a schematic diagram of automatic coefficient update circuit 215. This circuit can implement the zero forcing (ZF), least mean square (LMS) or any of the variants thereof, such as clipped LMS, hybrid LMS, or modified ZF-LMS. Circuit 215 receives the input signal samples, $X_k$, on bus 204 and the equalizer output, $Y_k$, on bus 205. Manually toggled switch 301 selectively couples $X_k$ or $Y_k$ to signal ROM 308 depending on which coefficient update algorithm is utilized. Specifically, for the ZF update algorithm, switch 301 couples $Y_k$ and for the other coefficient algorithms, switch 301 couples $X_k$. $Y_k$ is also coupled to target generating circuit 350 and decoder 302. Decoder 302 advantageously converts the digital word format of $Y_k$ into a serial bit stream on lead 321 for interfacing with a transmission system or test equipment.

Target circuit 350, comprising target ROM 304, delay element 303 and summer 305, generates an error signal, $e_k$, expressed as:

$$e_k = Y_k - d_k; \quad (5)$$

where $d_k$ is the closest one of the ideal transmitted signal levels for any $Y_k$.

Target ROM 304 quantizes each $Y_k$ address into a value $d_k$ which is applied to summer 305. Summer 305 determines the value of $e_k$ from the supplied values of $d_k$ and $Y_k$. Delay unit 303 supplies an appropriate delay so that each value of $Y_k$ and each associated value of $d_k$ arrive at summer 305 at the same time.

Error signal $e_k$ is distributed to two points. First, $e_k$ is advantageously converted to an analog signal appearing on lead 330 by digital-to-analog (D/A) converter 306; this allows the settling time of the equalizer to be measured. Such measurement can be beneficial in analyzing the effects of different coefficient algorithms on different types of distortion. Second, $e_k$ is applied to error-mapping ROM 307 which maps $e_k$ into $e'_k$. Signal ROM 308 provides a similar mapping of the $X_k$ or $Y_k$ output of switch 301 into quantity $W'_k$. RAMs 309 and 310, each having their read/write (R/W) and address (addr) leads selectively connected to control bus 210, respectively store the quantities $e'_k$ and $W'_k$. These quantities are used by correlator 311 to determine the positive or negative changes, $\Delta C_i$, of each coefficient. While each updated coefficient can be determined by algebraically adding each $\Delta C_i$ value with the corresponding present coefficient value, $C_i$, preferably each $\Delta C_i$ value is mapped via coefficient ROM 312 into a $\Delta C'_i$ value. Each updated coefficient value is then determined via summer 313 by algebraically adding each $\Delta C'_i$ with the corresponding present coefficient value, $C_i$, from delay element 231. To avoid improper coefficient convergence which can arise with the use of certain coefficient update algorithms, the updated coefficient values are coupled through sensing circuit 320 before passing through switches 230 and 213 to delay element 211.

The mapping functions provided by error ROM 307, signal ROM 308 and coefficient ROM 312 can be linear, for example, $e'_k = e_k$; or they can be nonlinear, for example, $e'_k$ = algebraic sign (sgn) of $e_k$. The use of the mapping ROMs increases the flexibility of adaptive equalizer 200 in two ways. First, by merely changing the mapping functions provided by error ROM 307 and signal ROM 308, the following update algorithm can be utilized:

| Coefficient Update Algorithm | Form of $\Delta C_i$ |
|---|---|
| Zero forcing (ZF) | Sgn[$E_k$] Sgn[$Y_k$] |
| Linear Least Mean Square (LMS) | $e_k X_k$ |
| Clipped LMS | $e_k$ Sgn[$X_k$] |
| Hybrid LMS | Sgn[$e_k$] $X_k$ |
| Modified ZF-LMS | Sgn[$e_k$] Sgn[$X_k$] |

Second, the mapping function of error ROM 307 and coefficient ROM 312 can be chosen to minimize coefficient noise and/or control convergence speed.

Figure 4:
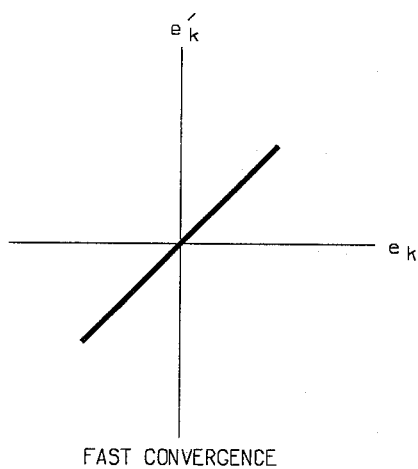
FIGS. 4 through 7 illustrate a variety of mapping functions that can be provided by the error, signal and coefficient ROMs in FIG. 3.
Figure 5:
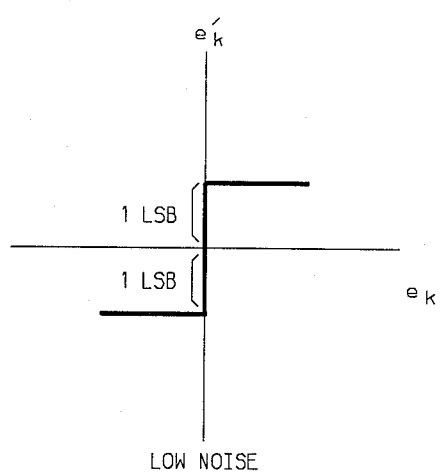
Figure 6:
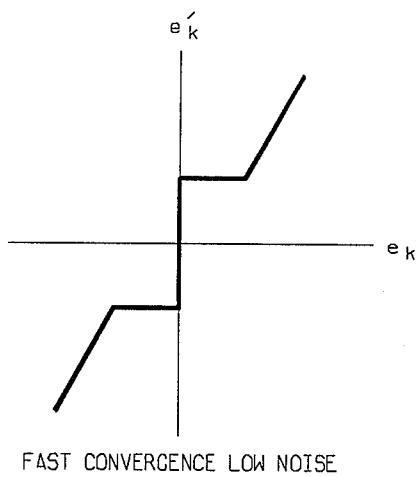
Figure 7:
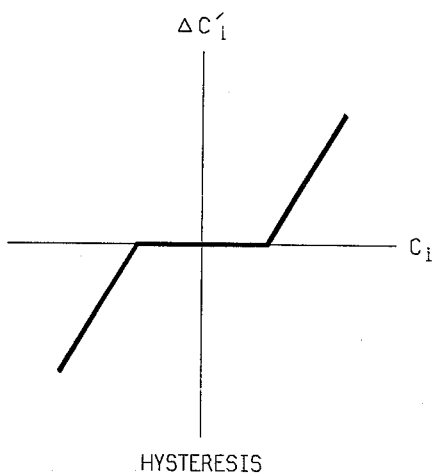

Four examples of mapping functions for error ROM 307 and coefficient ROM 312 are shown in FIGS. 4 through 7. A linear mapping function for error ROM 307 is shown in FIG. 4. The gradient of this linear function influences the speed of convergence of the equalizer. The steeper the gradient, the faster the convergence. However, steep gradients will cause coefficient noise enhancement once the coefficients have converged to their optimal values. For low noise, the error ROM mapping function should cause the smallest possible incremental change in the coefficients, i.e, an incremental change of one least-significant bit (LSB). Such a low noise mapping function is shown in FIG. 5. The mapping function of FIG. 6 combines the advantages of fast convergence and low noise. Finally, the hysteresis mapping function of FIG. 7 can be used in coefficient ROM 312 to provide noise reduction in the updating of coefficients. Such noise arises after coefficient convergence because there is a finite probability that the $\Delta C_i$ calculated by correlator 311 will not be zero. This causes continued coefficient updating. Providing a hysteresis mapping function in coefficient ROM 312 prevents this converged coefficient noise effect by supplying a $\Delta C'_i$ of zero when $\Delta C_i$ falls within a predetermined range. Hence, the converged coefficient values remain unchanged.

The required time period between coefficient updates is a function of the rate at which the transmission channel distortion changes. More specifically, for optimum equalizer performance, the coefficients have to change at a rate that is equal to or faster than the rate at which the distortion is changing. In systems where the distortion is changing slowly in comparision to the clock rate, simplicity in the update circuit can be achieved by use of time-sharing techniques. For example, in digital radio systems, multipath distortion changes in milliseconds while the clock rate is in nanoseconds. Stated in stochastic process terminology, multipath distortion is a nonstationary random process. However, because it slowly varies relative to the baud rate, over short time intervals the distortion can be considered ergodic and stationary. During these short time intervals, or sampling windows, all coefficients can be updated to equalize the stationary distortion. In equalizer 200, the signal and error information that are present in each sampling window are respectively mapped by error ROM 307 and signal ROM 308 into the quantities $e'_k$ and $W'_k$ which are then written into RAMs 309 and 310, respectively. The width of the sampling window can be as large as the RAM memory.

The stored values in the RAMs can be changed when each coefficient is updated. However, because the distortion can be considered constant over the time span of the sampling window for many system applications, all the coefficient update values can be calculated from one set of stored values. This approach is advantageously utilized in equalizer 200.

Refer now to FIGS. 3 and 8. The different incremental coefficient changes, $\Delta C_i$, are calculated by correlator 311 from the stored contents of RAMs 309 and 310. During the sampling window, M successive values of $e'_k$ and $W'_k$ are respectively written into specific memory addresses in RAMs 309 and 310, in response to signals on control bus 210. For purposes of simplicity, the memory locations in RAMs 309 and 310 storing $e'_k$ and $W'_k$, where k=1, 2 ... M, are both designated as 1 through M. The incremental change in the $C_o$ coefficient, $\Delta C_o$, is calculated by simultaneously reading out $e'_1$ and $W'_1$, $e'_2$ and $W'_2$, ..., and $e'_M$ and $W'_M$ via signals on control bus 210. Correlator 311 then multiplies the simultaneously received terms and averages the M products formed. Calculation of the incremental changes in the other coefficients is done by simply correlating time-shifted values of $e'_i$ and $W'_i$ for each coefficient. For example, the incremental change in coefficient $C_{-1}$ in FIG. 2 is calculated by averaging the M−1 products formed by multiplying $e'_1$ by $W'_2$, $e'_2$ by $W'_3$ ... $e'_{M-1}$ by $W'_M$. The appropriate $e'_k$ and $W'_k$ terms to form each product are read out of RAMs 309 and 310 by simply incrementing by one the initial RAM 310 memory location addressed for $C_{-1}$ correlation relative to the initial RAM 310 memory location for $\Delta C_o$ correlation. Accordingly, the contents of each of the locations 1 through M−1 in RAM 309 are read out in synchronism with the contents of locations 2 through M in RAM 310. Similarly, the incremental change in coefficient $C_{+1}$ in FIG. 2 is calculated by averaging the M−1 products formed by multiplying $e'_2$ by $W'_1$, $e'_3$ by $W'_2$ ... $e'_M$ by $W'_{M-1}$. The appropriate terms for each of these M−1 products are provided to correlator 311 by simply incrementing by one the initial memory location addressed in RAM 309 relative to the initial RAM 309 memory location for $\Delta C_o$ correlation. This process of offsetting the memory locations read out for one of the quantities $e'_k$ and $W'_k$ can be extended for any number of coefficients. Therefore, the incremental change of any coefficient, $\Delta C_i$, provided by the operation of RAMs 309 and 310 and correlator 311 can be expressed as $$\Delta C_i = \sum_{k=1}^{M} e_k' W_{k-i}' \tag{6}$$

$$\Delta C_i = \sum_{k=1}^{M} e_{k+i}' W_k' \tag{7}$$

After all of the coefficients are updated, RAMs 309 and 310 are reloaded with new values and the calculations for the $\Delta C_i$s are repeated.

Figure 9:
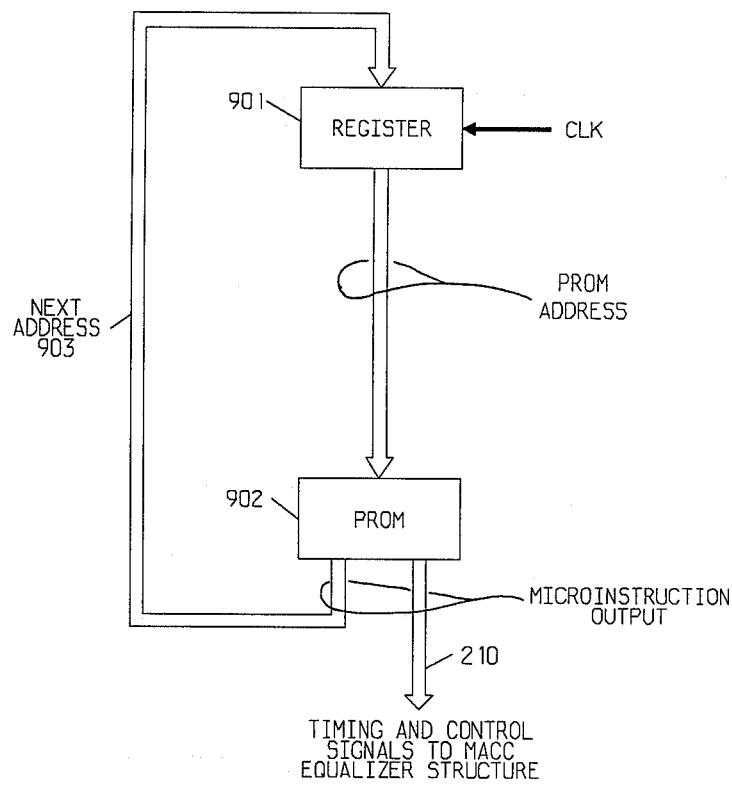
FIG. 9 is a schematic diagram of the circuitry within the controller of FIG. 2.

The control signals on bus 210 are generated from the baud rate clock signal, CLK, by controller 216. As shown in FIG. 9, controller 216 advantageously utilizes microprogramming control techniques to generate these control signals. Controller 216 includes register 901 and PROM 902 connected in a feedback loop.

PROM 902 is addressed by the contents of register 901 upon the occurrence of each CLK pulse. At start-up, register 901 stores a preselected initial PROM address. For each address, PROM 902 reads out a multibit word across the parallel leads forming multilead buses 210 and 903. Part of each multibit word represents the next PROM memory location to be addressed and is coupled across the leads forming bus 903 to register 901. The remaining bits of each multibit word contain the necessary control signals for equalizer 200 on each CLK pulse. Each of these remaining bits is coupled to a different lead of control bus 210. Accordingly, multiply-accumulate devices 201, 202, 203, switch 213, manual coefficient update circuit 214 and automatic coefficient update circuit 215 receive their respective control signals by interconnection to associated leads of control bus 210.

Figure 10:
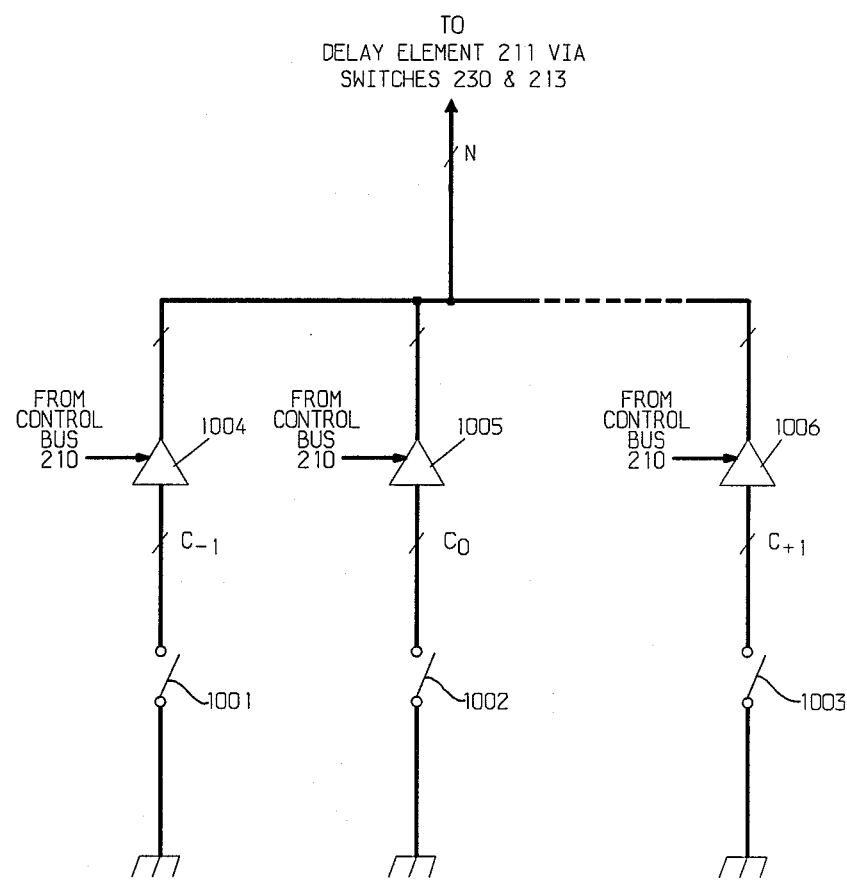
FIG. 10 is a schematic diagram of the manual coefficient update circuit of FIG. 2.

Refer now to FIG. 10 which shows a schematic circuit of manual coefficient update circuit 214. Circuit 214 comprises three N-pole switches 1001, 1002, 1003 which are respectively connected to the inputs of tristate gates 1004, 1005 and 1006. The opening and closing of each pole of an N-pole switch respectively generates a logic "1" and "0" on a tristate gate input lead. Therefore, any value of coefficient $C_{-1}$, $C_o$ and $C_{+1}$ can be generated by the appropriate toggling of switches 1001, 1002 and 1003. These values are coupled through tristate gates 1004, 1005 and 1006 to delay element 211 at the appropriate times via signals from control bus 210. At other times, each of the tristate gates provides a high impedance output.

As described in a publication by J. E. Mazo entitled "Analysis of Decision-Directed Equalizer Convergence", *Bell System Technical Journal*, Vol. 59, No. 10, December 1980, pp. 1857–1877, improper coefficient convergence can result with the use of automatic coefficient update algorithms. This improper convergence falls into one of three observable forms known as nonoptimum minima, reduced output amplitude and negative coefficient sets. Advantageously, equalizer 200 incorporates circuitry which precludes these forms of improper convergence.

Improper convergence resulting in nonoptimum minima produces significantly varying coefficient values and causes the equalizer output to fall outside of a normal range. In equalizer 200, this normal range is selected so that the absolute value of the output on bus 205 is less than 1.0. By using two's complement arithmetic in multiply-accumulate devices 201, 202 and 203, this range is equivalent to saying that the two most significant bits on bus 205 are not the same when the output falls outside the normal range. By connecting Exclusive-OR gate 217 to receive the two most significant bits, an equalizer output falling outside the normal range is detected by the generation of a logic "1" at the output of gate 217. This logic level conveniently provides an "overflow flag" which resets the values in delay elements 211, 221 and 231 to zero thereby allowing migration of the coefficients to their proper values.

When reduced output amplitude and negative coefficient sets result from improper coefficient convergence, the value of the center coefficient, $C_o$, is less than some preselected value or is negative. These forms of improper convergence, which adversely affect the operation of a digital decoder, are avoided by coupling all the updated coefficients through sensing circuit 320 shown in FIG. 3. Within sensing circuit 320, $C_o$ comparator 314, enabled by a signal from control bus 210, compares the value of updated coefficient $C_o$ against a preselected positive threshold. When the updated coefficient falls below the threshold, a signal is sent to tristate gates 315 and 316 to replace the improper $C_o$ value which would have been coupled to delay element 211 with a substituted $C_o$ value. The value of any substituted $C_o$ is a function of the modulation format and the signal levels transmitted therein. For example, for a 16 QAM format with signal levels of $+1$ and $+3$ volts for the I and Q rails, the substituted value of $C_o$ is equal to 0.67.

It should, of course, be understood that the disclosed embodiment is merely illustrative of a variety of structures which may be apparent to those skilled in the art without departing from the spirit and scope of the present invention.

I claim:

1. An adaptive equalizer comprising
   a plurality of multipliers for multiplying each of a succession of input signal samples by an associated coefficient in an ensemble of coefficients, each of said input signal samples occurring at a predetermined rate,
   a plurality of summers, each responsive to a different one of said multipliers for providing an equalized output signal in response to products formed by that one multiplier,
   means for successively associating each of the coefficients in the ensemble with a different one of said plurality of multipliers to form the products of said samples and coefficients, and
   means for revising each coefficient in said ensemble as a function of said equalized output signal, said revising means comprising time-shared means for serially determining each revised coefficient and supplying each revised coefficient in a serial manner to said associating means at a submultiple of said rate.

2. The equalizer of claim 1 wherein said revising means revises said coefficients as a function of said equalized output signal and said input signal samples.

3. The equalizer of claim 1 wherein said revising means revises said coefficients at selected times.

4. The equalizer of claim 1 wherein said associating means comprises a plurality of delay elements serially connected in a loop.

5. The equalizer of claim 1 wherein said associating means resets all of said coefficients to a preselected value in response to said equalized output signal.

6. The equalizer of claim 1 wherein said revising means includes means for storing a common set of stored data and said revising means revises each of said coefficients by multiplying a different subset of data in said common set of stored data.

7. The equalizer of claim 6 wherein said common set of data is updated in response to said equalizer output signal at selected times.

8. The equalizer of claim 6 wherein said common set of data is updated in response to said input signal samples and said equalizer output signal at selected times.

9. The equalizer of claim 6 wherein said revising means includes means for comparing a selected one of said revised coefficients against a second threshold.

10. The equalizer of claim 9 wherein said revising means further includes means for resetting only said selected revised coefficient to a preselected value in response to said comparing means.

11. The equalizer of claim 1 further comprising means for storing a fixed ensemble of coefficients.

12. The equalizer of claim 11 further comprising means for selectively connecting said associating means to said storing means and said revising means.

* * * * *

UNITED STATES PATENT AND TRADEMARK OFFICE
CERTIFICATE OF CORRECTION

PATENT NO. : 4,773,034

DATED : September 20, 1988

INVENTOR(S) : Walter Debus, Jr.

It is certified that error appears in the above-identified patent and that said Letters Patent is hereby corrected as shown below:

Column 3, line 42, "$C_{+1}$ and $X_{+1}$" should read --$C_{-1}$ and $X_{+1}$--.

Signed and Sealed this

Nineteenth Day of December, 1989

*Attest:*

JEFFREY M. SAMUELS

*Attesting Officer*  *Acting Commissioner of Patents and Trademarks*